US009514848B2

(12) United States Patent
Wu et al.

(10) Patent No.: US 9,514,848 B2
(45) Date of Patent: Dec. 6, 2016

(54) SOLID STATE DRIVE AND ASSOCIATED ERROR CHECK AND CORRECTION METHOD

(71) Applicants: LITE-ON ELECTRONICS (GUANGZHOU) LIMITED, Guangzhou (CN); LITE-ON TECHNOLOGY CORPORATION, Taipei (TW)

(72) Inventors: Sheng-Han Wu, Taipei (TW); Chih-Wei Ke, Taipei (TW); Wei-Hwa Jao, Taipei (TW); Jen-Chien Fu, Taipei (TW)

(73) Assignees: LITE-ON ELECTRONICS (GUANGZHOU) LIMITED, Guangzhou (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/509,563

(22) Filed: Oct. 8, 2014

(65) Prior Publication Data

US 2015/0286527 A1    Oct. 8, 2015

(30) Foreign Application Priority Data

Apr. 3, 2014 (CN) .......................... 2014 1 0133835
Jul. 18, 2014 (CN) .......................... 2014 1 0344519

(51) Int. Cl.
| | | |
|---|---|---|
| *G11C 29/42* | (2006.01) | |
| *G06F 11/14* | (2006.01) | |
| *G06F 12/00* | (2006.01) | |
| *G11B 20/18* | (2006.01) | |
| *G11C 29/52* | (2006.01) | |
| *G11C 11/56* | (2006.01) | |
| *G11C 29/02* | (2006.01) | |
| *G06F 11/10* | (2006.01) | |
| *G11C 29/04* | (2006.01) | |

(52) U.S. Cl.
CPC .......... *G11C 29/52* (2013.01); *G06F 11/1048* (2013.01); *G11C 11/5642* (2013.01); *G11C 29/028* (2013.01); *G11C 2029/0411* (2013.01)

(58) Field of Classification Search
CPC .............. G06F 11/0793; G06F 11/07; G06F 11/0721; G06F 11/073; G06F 11/08; G06F 11/1048; G06F 11/1068; G06F 11/0703; G06F 11/0751; G11C 11/5642; G11C 16/26; G11C 16/349; G11C 29/52; G11C 2029/0411; H04W 76/02; G11B 20/18; G11B 2020/183
See application file for complete search history.

(56) References Cited

U.S. PATENT DOCUMENTS

| | | | | |
|---|---|---|---|---|
| 8,510,636 B2 * | 8/2013 | Ruby | ................... | G06F 11/1048 365/185.09 |
| 8,737,133 B2 * | 5/2014 | Sridharan | .......... | G11C 16/0483 365/185.03 |
| 8,984,365 B1 * | 3/2015 | Norrie | ................ | H03M 13/1111 714/755 |

(Continued)

*Primary Examiner* — Phung M Chung
(74) *Attorney, Agent, or Firm* — WPAT, PC; Justin King

(57) ABSTRACT

A solid state drive includes: a processing circuit for receiving a read command from the host; a flash memory connected to the processing circuit; and a buffer connected to the processing circuit. An error check and correction method includes following steps. Firstly, a read data retrieved from the flash memory is verified according to a predetermined algorithm when receiving the read command. Then, the read data is outputted by the processing circuit when the read data has no uncorrectable error. Furthermore, a retry action is performed according to a retry table when an error of the read data is uncorrectable. A usage order of a plurality of algorithms is defined in the retry table.

19 Claims, 5 Drawing Sheets

(56) References Cited

U.S. PATENT DOCUMENTS

| | | | |
|---|---|---|---|
| 9,230,670 B2* | 1/2016 | Park | G11C 29/70 |
| 9,235,488 B2* | 1/2016 | Norrie | G06F 11/2215 |
| 2005/0197795 A1* | 9/2005 | Aas | G01R 35/005 |
| | | | 702/107 |
| 2013/0080858 A1* | 3/2013 | Lee | G11C 16/349 |
| | | | 714/773 |
| 2014/0281828 A1* | 9/2014 | Micheloni | G06F 11/00 |
| | | | 714/773 |
| 2014/0359202 A1* | 12/2014 | Sun | G11C 16/34 |
| | | | 711/103 |

* cited by examiner

| | hard | soft | algorithm | correction |
|---|---|---|---|---|
| 1 | 1 | 0 | min-sum hard | 0 |
| 2 | 0 | 1 | min-sum soft | 0 |
| 3 | 1 | 1 | min-sum soft | 0 |
| 4 | 0 | 0 | 0 | 1 |
| ⋮ | ⋮ | ⋮ | ⋮ | ⋮ |

SOLID STATE DRIVE AND ASSOCIATED ERROR CHECK AND CORRECTION METHOD

This application claims the benefits of People's Republic of China Application Serial No. 201410133835.4, filed Apr. 3, 2014, and Serial No. 201410344519.1, filed Jul. 18, 2014, the subject matters of which are incorporated herein by reference.

FIELD OF THE INVENTION

The present invention relates to a solid state drive and associated method, and more particularly to a solid state drive and associated error check and correction method.

BACKGROUND OF THE INVENTION

As is well known, a solid state drive (hereinafter, SSD) is a data storage drive that uses NAND flash memories to store data. Solid state drive with NAND flash memories is a non-volatile memory device. After being written to the non-volatile memory, the data are retained in the solid state drive even if power supply system is off.

It is well known that the flash memory includes a memory cell array composed of plural memory cells. Each memory cell in the flash memory includes a floating gate transistor.

In a program cycle, hot carriers, such as electronics, are injected to a floating gate of the floating gate transistor. With the injected hot carriers, the threshold voltage of the floating gate transistor will change and various storage states are accordingly generated. Different storage states are corresponding to various distributions of threshold voltage.

FIG. 1 is a schematic diagram illustrating storage state versus threshold voltage distribution of the flash memory. Take a flash memory with single-level cell (hereinafter, SLC) as an example, a memory cell may have two storage states, that is, a first storage state (E) and a second storage state (A).

By calculating the threshold voltage of all memory cells, it is found that distributions of the threshold voltages of the memory cells at the first storage state (E) are close to a first threshold voltage level $V_{THE}$, and distributions of the threshold voltages of the memory cells at the second storage state (A) are close to a second threshold voltage level $V_{THA}$. Thus, a slice voltage (Vs) can be utilized to determine storage states of most of the memory cells. That is to say, the memory cells with threshold voltage less than the slice voltage are determined to be at the first storage state (E), and the memory cells with threshold voltage greater than the slice voltage are determined to be at the second storage state (A).

However, when threshold voltages of some memory cells at the first storage state (E) are greater than the slice voltage (Vs), these memory cells will be mistakenly determined as being at the second storage state (A). Similarly, when threshold voltages of some memory cells at the second storage state (A) are less than the slice voltage (Vs), these memory cells will be mistakenly determined as being at the first storage state (E).

Similarly, storage states of a flash memory with multi-level cell (hereinafter, MLC) may be mistakenly determined. In such case, the solid state drive needs a mechanism to correct the error.

FIG. 2 is a schematic diagram illustrating a conventional solid state drive. The solid state drive 10 includes a processing circuit 101, a buffer 107 and a flash memory 105. Between the processing circuit 101 and the host 12, an external bus 14 is used to transmit command and data. The external bus 14 may be a USB bus, an IEEE 1394 bus or a SATA bus etc.

When the host 12 writes data to the flash memory 105, the host 12 will transmit a write command and write data to the solid state drive 10. Meanwhile, the ECC controller 103 in the processing circuit 101 will generate an error check and correction (hereinafter, ECC) code corresponding to the write data. Afterward, the processing circuit 101 will write both the write data and the ECC code to the flash memory 105.

When the host 12 needs to read the data stored in the flash memory 105, the host 12 will generate a read command to the solid state drive 10. After retrieving a read data and its corresponding ECC code from the flash memory 105, the processing circuit 101 temporarily stores the read data and the ECC code to the buffer 107. Then, the ECC controller 103 will verify the read data according to the ECC code. After the ECC controller 103 confirms correctness of the read data, the processing circuit 101 will output the read data to the host 12.

In general, a conventional ECC controller 103 corrects read data by utilizing only one ECC algorithm. When the ECC controller 103 confirms the error of the read data is uncorrectable, the processing circuit 101 cannot output correct read data. Meanwhile, the processing circuit 101 will mark a position of the incorrect read data in the flash memory 105. Later, the processing circuit 101 will retry to correct the incorrect read data when the solid state drive 10 is in a standby mode.

Therefore, in a case that the error of the read data is uncorrectable, the processing circuit 101 cannot recover the read data in real time but has to wait until the standby mode to retry to correct the error. An attempt of correcting the error of the read data in real time results in dramatic drop of data throughput of the solid state drive 10 and seriously affects performance of the solid state drive 10.

SUMMARY OF THE INVENTION

A first embodiment of the present invention provides a solid state drive. The solid state drive is connected to a host through an external bus. The solid state drive includes: a processing circuit, connected to the external bus for receiving a read command from the host; a flash memory, connected to the processing circuit; and a buffer, connected to the processing circuit, wherein the processing circuit further comprises an error check and correction (hereinafter, ECC) controller, wherein a read data and a corresponding ECC code are retrieved from the flash memory and temporarily stored to the buffer by the processing circuit, and the ECC controller verifies the read data according to a predetermined algorithm and the ECC code, wherein when an error of the read data is uncorrectable, a retry action is performed according to a retry table, wherein a usage order of a plurality of algorithms is defined in the retry table.

A second embodiment of the present invention provides an error check and correction method of a solid state drive. The solid stage drive includes a processing circuit for receiving a read command from a host; a flash memory connected to the processing circuit; and the processing circuit comprises an error check and correction controller. The method comprises steps of: verifying a read data retrieved from the flash memory according to a predetermined algorithm when receiving the read command; outputting the read data by the processing circuit when the read data has no uncorrectable error, and performing a retry action according to a retry table when an error of the read data is uncorrectable, wherein a usage order of a plurality of algorithms is defined in the retry table.

A third embodiment of the present invention provides an error check and correction method of a solid state drive. The solid stage drive includes a processing circuit for receiving a read command from a host; a flash memory connected to the processing circuit; and the processing circuit comprises an error check and correction controller. The method includes steps of: retrieving a block usage information of a block corresponding to a read address in the read command; utilizing a first algorithm to verify a read data retrieved from the flash memory when the block usage information is abnormal; outputting the read data when the read data has no uncorrectable error; and performing a retry action according to a first retry table when an error of the read data is uncorrectable. A usage order of a plurality of algorithms is defined in the first retry table.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention provides a solid state drive capable of maintaining data throughput of the solid state drive itself. A retry action is previously defined in the solid state drive so that the ECC controller can change the algorithm for calibration according to the retry action even when an error of the read data is uncorrectable. Thus, the read data can be outputted in a real time manner and the high data throughput of the solid state drive is maintained.

Figure 1:
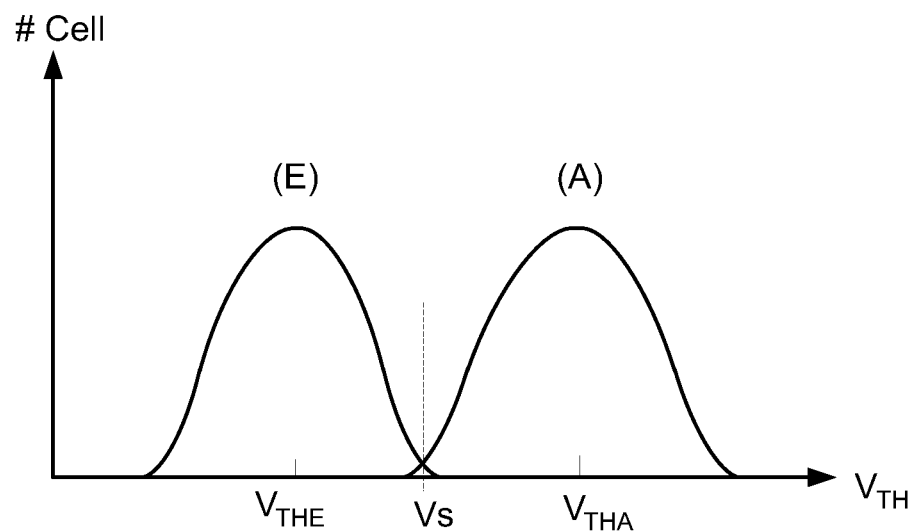
FIG. 1 (prior art) is a schematic diagram illustrating storage state versus threshold voltage distribution of the flash memory.
Figure 2:
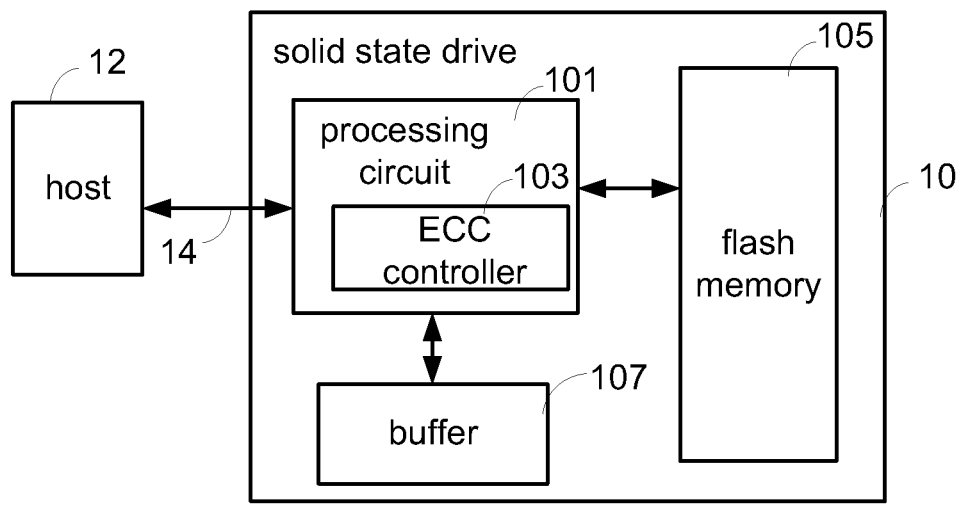
FIG. 2 (prior art) is a schematic diagram illustrating a conventional solid state drive.
Figures 3, 4:
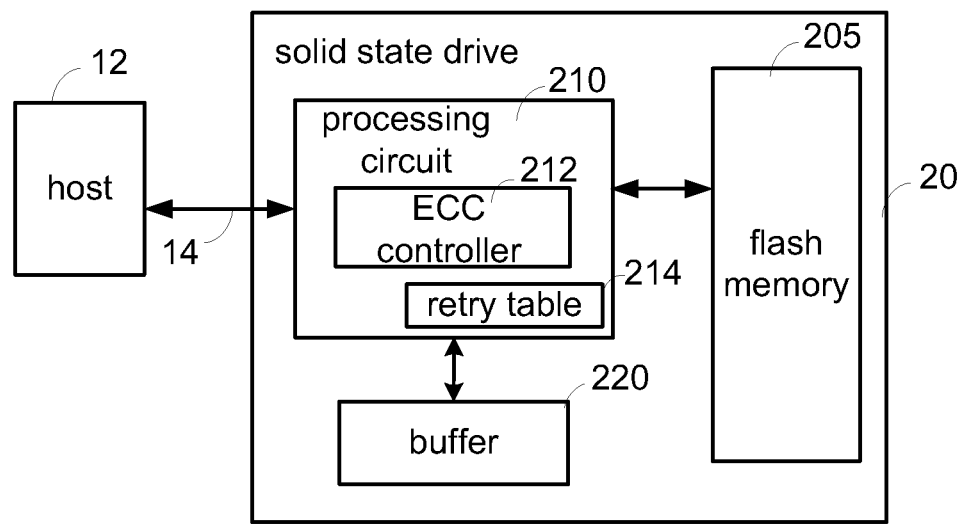
FIG. 3 is a schematic diagram illustrating a solid state drive according to an embodiment of the present invention.
FIG. 4 is a schematic diagram illustrating the retry table for the retry action according to the embodiment of the present invention.

FIG. 3 is a schematic diagram illustrating a solid state drive according to an embodiment of the present invention. The solid state drive 20 includes a processing circuit 210, a buffer 220 and a flash memory 205. An external bus 14 is outside the SSD 20, for transmitting command and data between the processing circuit 210 and the host 12. The external bus 14 may be a USB bus, an IEEE 1394 bus or a SATA bus etc.

When the host 12 needs to read data stored in the flash memory 205, the host will transmit a read command to the SSD 20. Meanwhile, the processing circuit 210 retrieves the read data and corresponding ECC code from the flash memory 205. The read data and the ECC code are thus temporarily stored in the buffer 220. Consequently, the ECC controller 212 will verify the read data according to ECC code stored in the buffer 220. According to an embodiment of the present invention, the SSD 20 further comprises a retry table 214 previously defined in the processing circuit 210, and the ECC controller 212 can correct the error of the read data by using plural ECC algorithms in real time based on instructions predefined in the retry table 214.

When the ECC controller 212 confirms the error of the read data is uncorrectable, the ECC controller 212 will change the algorithm for correction according to content of the retry table 214. Or, the ECC controller 212 will change other control factors and retry to correct the error of the read data according to content of the retry table 214. Furthermore, a min-sum hard algorithm, a min-sum soft algorithm, a sum-product hard algorithm, a sum-product soft algorithm, a bit flipping hard algorithm, or a bit flipping soft algorithm can be applied. The ECC algorithms used in the present invention are not limited and the ECC controller 212 may also execute other ECC algorithms.

FIG. 4 is a schematic diagram illustrating the retry table for the retry action according to the embodiment of the present invention. The retry table shown in FIG. 4 is only an example and should not be a limitation of the present invention. For instance, when the ECC controller 212 confirms the error of the read data is uncorrectable according to a predetermined algorithm, the ECC controller 212 will perform the retry action according to the content of the retry table.

According to the first instruction (1) shown in the retry table, the ECC algorithm executed by the ECC controller 212 is a min-sum hard algorithm. Furthermore, the processing circuit 210 transmits a hard read command to the flash memory 205 to retrieve a hard bit of read data and a corresponding ECC code for updating the buffer 220. The processing circuit 210 again attempts to correct the error of the read data according to the hard bit of read data and the ECC code. If the ECC controller 212 successfully corrects the error of the read data, the processing circuit 210 outputs the corrected read data to the host. Otherwise, a second instruction (2) is executed when the error of the read data is uncorrectable by the min-sum hard algorithm according to the first instruction (1).

According to the second instruction (2) in the retry table, the algorithm executed by the ECC controller 212 is changed to a min-sum soft algorithm. Furthermore, the processing circuit 210 transmits a soft read command to the flash memory 205 to retrieve a soft bit of read data and corresponding ECC code for updating the buffer 220. The processing circuit 210 again attempts to correct the error of the read data according to the soft bit of read data and the ECC code. If the ECC controller 212 successfully corrects the error of the read data this time, the processing circuit 210 outputs the corrected read data to the host. Otherwise, a third instruction (3) is executed when the error of the read data is uncorrectable by the min-sum soft algorithm according to the second instruction (2).

According to the third instruction (3) in the retry table, the algorithm executed by the ECC controller 212 is changed to min-sum soft algorithm. Furthermore, the processing circuit 210 transmits a hard and a soft read commands to the flash memory 205 to retrieve a hard bit of the read data and a soft bit of read data and corresponding ECC code for updating the buffer 220. The processing circuit 210 again attempts to correct the error of the read data according to the hard bit and the soft bit of read data and the ECC code. If the ECC controller 212 successfully corrects the error of the read data this time, the processing circuit 210 outputs the corrected read data to the host. Otherwise, a fourth instruction (4) is executed when the error of the read data is uncorrectable by the min-sum soft algorithm according to the third instruction (3).

In the embodiment, the fourth instruction (4) of the retry table does not execute another error correction algorithm but a calibration procedure. Since changing ECC algorithms in the previous instructions cannot produce correct read data, the retry table thus requires the processing circuit 210 to perform the calibration procedure to the flash memory 205. In the calibration procedure, the processing circuit 210 calibrates the slice voltage Vs for retrieving a calibrated slice voltage. The calibrated slice voltage is used later. Whether the calibration procedure is provided is dependent on practical applications. That is, the calibration procedure in the retry table is optional according to the present invention.

Furthermore, the retry table after the fourth instruction (4) can also adopt other ECC algorithms to proceed the retry action. The instructions may be similar to the above instructions and not redundantly described.

Basically, when designing instruction content of the retry table, a designer of the SSD 20 can refer to characteristics of the flash memory 205. Therefore, error of the read data can be calibrated during the retry action in real time by following the instructions defined in the retry table and outputted to the host 12 immediately. Consequentially, the high data throughput of the SSD 10 will be maintained.

Figure 5:
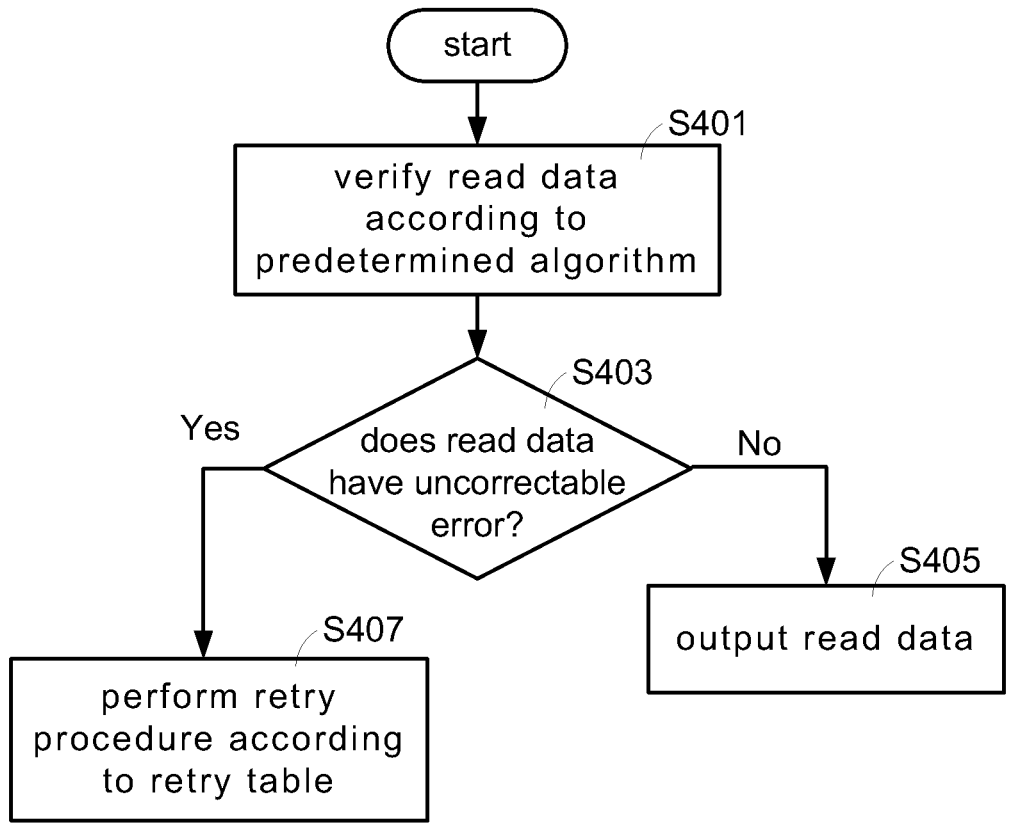
FIG. 5 is a schematic diagram illustrating the ECC method according to the first embodiment of the present invention.

FIG. 5 is a schematic diagram illustrating the ECC method according to the first embodiment of the present invention. The ECC method is proceeded when the processing circuit 210 receives the read command. Then, the ECC controller 212 will verify the read data retrieved from the flash memory 205 according to the predetermined algorithm (step S401).

When the ECC controller 212 confirms the read data does not have uncorrectable error (step S403), the processing circuit 210 will output the read data (step S405). On the other hand, when the ECC controller 212 confirms the read data has uncorrectable error (step S403), the ECC controller 212 will perform a retry action according to the content of the retry table (step S407).

Figure 6:
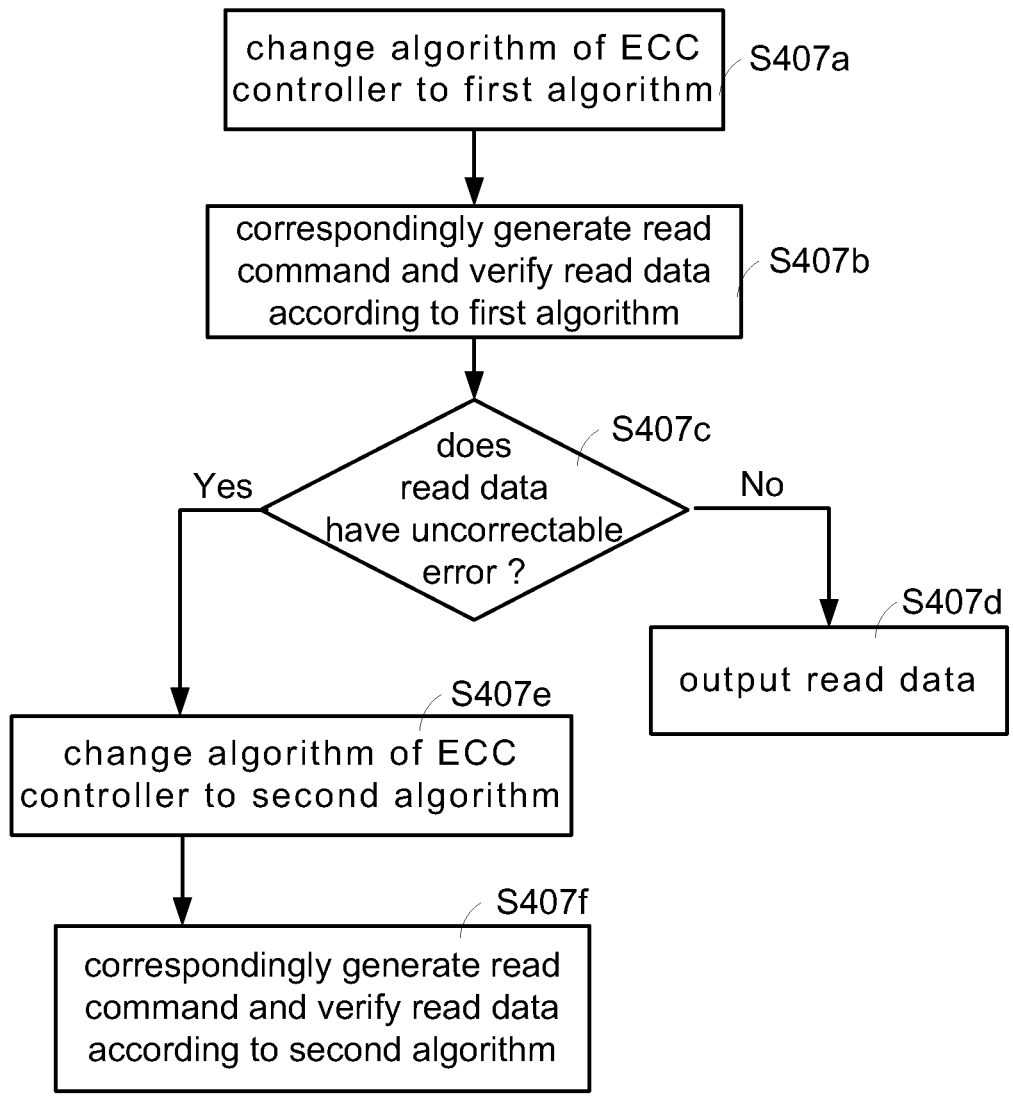
FIG. 6 is a schematic diagram illustrating a retry action is performed according to the retry table.

FIG. 6 is a schematic diagram illustrating a retry action is performed according to the retry table. When the retry action is performed, the algorithm executed by the ECC controller 212 is changed to a first algorithm (step S407a). A read command corresponding to the first algorithm is generated to verify the read data retrieved from the flash memory 205 (step S407b).

When the ECC controller 212 confirms the read data does not have uncorrectable error (step S407c), the processing circuit 210 outputs the read data (step S407d).

On the other hand, when the ECC controller 212 confirms the error of the read data is uncorrectable (step S407c), the algorithm executed by the ECC controller 212 will change to a second algorithm (step S407e). Furthermore, a read command corresponding to the second algorithm is accordingly generated to verify the read data retrieved from the flash memory 205 (step S407f).

According to the above illustrations, the usage order of the ECC algorithms is determined according to the content of the retry table. However, the present invention is not limited to changing usage order of the ECC algorithms. The instruction content predetermined in the retry table comprises but not limited to the retry actions of changing the ECC algorithm, updating the hard bit of the read data, updating the soft bit of the read data, and/or proceeding the calibration procedure before verify the read data again. Furthermore, when the ECC controller 212 confirms the read data has no error, the processing circuit 210 can output the read data immediately and terminate the retry action.

Based on the above illustrations, a solid state drive and associated ECC method are provided by the present invention. When the error of the read data is uncorrectable, the ECC controller will perform a retry action according to instructions in the retry table to correct error of the read data in a real time manner. Consequently, the read data can be outputted in real time, and the high data throughput of the solid state drive can be maintained.

Furthermore, after repeatedly data programming and erasing of the flash memory 205, characteristics of memory cells in the flash memory 205 become worse. Thus, another set of algorithm and retry table are provided to memory cells with worse characteristics according to the present invention. In other words, varied from characteristics of the memory cells, different retry actions are correspondingly provided based on the present invention.

Basically, the flash memory 205 uses a block as a unit of erasing. Size of the block may be defined as 2 Kbyte, 4 Kbyte, 8 Kbyte or the like. In the flash memory 205, each block is corresponding to a block usage information. The block usage information may represent erase count of the block, data retention characteristic of the block, etc. Certainly, voltage level of the slice voltage may also be a type of the block usage information. Furthermore, the block usage information may be environmental condition such as environment temperature or environment humidity, etc. The block usage information according to the present invention is not limited to above types.

According to the embodiment of the present invention, when the erase count of the block is greater than a threshold count, the data retention characteristic of the block becomes worse, or the voltage level of the slice voltage is lower than a threshold slice voltage, the block usage information is considered as abnormal. Thus, the block corresponding to the abnormal block usage information contains memory cells with worse characteristics and the block should adopt another set of ECC algorithm and retry table.

Figure 7:
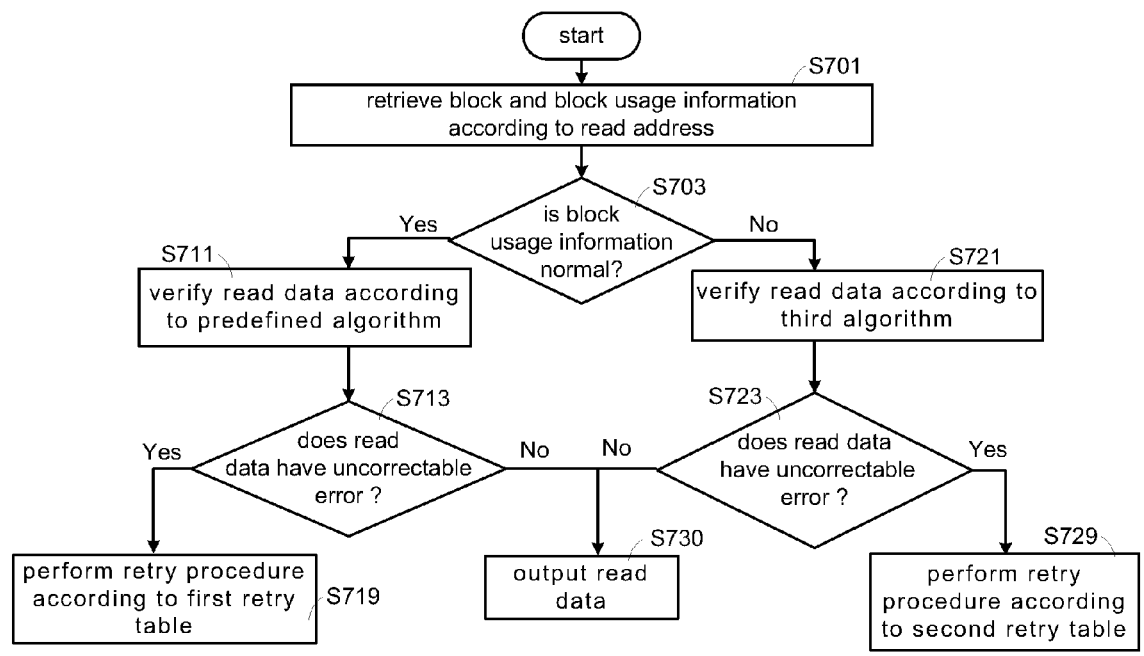
FIG. 7 is a schematic diagram illustrating the ECC method according to a second embodiment of the present invention.

FIG. 7 is a schematic diagram illustrating the ECC method according to a second embodiment of the present invention. First, when the processing circuit 210 receives the read command, a block and its corresponding block usage information are retrieved according to a read address (step S701). In addition, the block usage information is determined to be normal or abnormal (step S703).

When the processing circuit 210 confirms the block usage information is normal, the memory cells in the block are considered to be healthy/good. Thus, the ECC controller 210 verifies correctness of the read data retrieved from the flash memory 205 according to the predetermined algorithm (step S711).

When the ECC controller 212 confirms the read data does not have any uncorrectable error (step S713), the processing circuit 210 outputs the read data (step S730). In contrast, when the ECC controller 212 confirms the read data has uncorrectable error (step S713), the ECC controller 212 performs the retry action according to the content of the first retry table (step S719).

Furthermore, when the processing circuit 210 confirms the block usage information is abnormal, it implies characteristics of the memory cells in the block become unhealthy/worse. Meanwhile, the ECC controller 212 verifies the read data retrieved from the flash memory 205 according to a third algorithm (step S721).

When the ECC controller 212 confirms the read data does not have uncorrectable error (step S723), the processing circuit 201 outputs the read data (S730). On the other hand, when the ECC controller 212 confirms the read data has uncorrectable error (step S723), the ECC controller 212 will perform the retry action according to content of the second retry table (step S729).

Furthermore, the retry action in the second embodiment can be implemented according to the flow shown in FIG. 6. Thus, details are not redundantly described.

Based on the above illustrations, depending on characteristics of memory cells, different algorithms are provided for verifying the read data according to the second embodiment of the present invention. In addition, when an uncorrectable error exists in the read data, another retry table is provided to perform the retry action.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state drive, connected to a host through an external bus, comprising:
   a processing circuit, connected to the external bus for receiving a read command from the host, wherein the processing circuit further comprises an error check and correction (hereinafter, ECC) controller;
   a flash memory, connected to the processing circuit; and
   a buffer, connected to the processing circuit,
   wherein a read data and a corresponding ECC code are retrieved from the flash memory and temporarily stored to the buffer by the processing circuit, and the ECC controller verifies the read data according to a predetermined algorithm and the ECC code, wherein when an error of the read data is uncorrectable, a retry action is performed according to a retry table, wherein a usage order of a plurality of algorithms is defined in the retry table,
   wherein, the plurality of algorithms includes at least two different ECC algorithms for being executed by the ECC controller,
   wherein, during the retry action, one of the ECC algorithms is selected according the usage order and executed by the ECC controller to correct the error of the read data.

2. The solid state drive as claimed in claim 1, wherein the ECC controller changes the predetermined algorithm to a first algorithm and correspondingly generates a read command to verify the read data according to the first algorithm during the retry action, wherein the processing circuit outputs the read data when the ECC controller confirms the read data has no uncorrectable error, and the ECC controller changes the first algorithm to a second algorithm when the ECC controller confirms the read data has an uncorrectable error.

3. The solid state drive as claimed in claim 1, wherein the processing circuit retrieves a hard bit of the read data or a soft bit of the read data from the flash memory according to the retry table for verifying the read data in the retry action.

4. The solid state drive as claimed in claim 1, wherein a calibration procedure, for the processing circuit to calibrate a slice voltage of the flash memory, is defined in the retry table.

5. The solid state drive as claimed in claim 1, wherein the processing circuit retrieves the read data and the corresponding ECC code from a block of the flash memory according to a read address in the read command, and the ECC controller utilizes a first algorithm and the ECC code to verify the read data when a block usage information corresponding to the block is abnormal, wherein the first algorithm is different from the predetermined algorithm.

6. The solid state drive as claimed in claim 5, wherein the ECC controller performs the retry action according to an another retry table when an error of the read data is uncorrectable, wherein an another usage order of a plurality of algorithms is defined in the another retry table.

7. The solid state drive as claimed in claim 5, wherein the block usage information is an erase count of the block, a data retention characteristic of the block, a slice voltage or an environmental condition.

8. The solid state drive as claimed in claim 7, wherein the environmental condition comprises an environment temperature, or an environment humidity.

9. An error check and correction method of a solid state drive, wherein the solid stage drive comprises a processing circuit for receiving a read command from a host; and a flash memory connected to the processing circuit, wherein the processing circuit comprises an error check and correction controller, and the method comprising the steps of:
   verifying a read data retrieved from the flash memory according to a predetermined algorithm when receiving the read command;
   outputting the read data by the processing circuit when the read data has no uncorrectable error, and
   performing a retry action according to a retry table when an error of the read data is uncorrectable, wherein a usage order of a plurality of algorithms is defined in the retry table,
   wherein, the plurality of algorithms includes at least two different ECC algorithms for being executed by the ECC controller,
   wherein, during the retry action, one of the ECC algorithms is selected according the usage order and executed by the ECC controller to correct the error of the read data.

10. The error check and correction method as claimed in claim 9, wherein the step of performing the retry action further comprises steps of:
    changing the predetermined algorithm to a first algorithm;
    correspondingly generating a read command to verify the read data according to the first algorithm;
    outputting the read data when the read data has no uncorrectable error; and
    changing the first algorithm to a second algorithm when the read data has an uncorrectable error.

11. The error check and correction method as claimed in claim 9, wherein the processing circuit retrieves a hard bit of the read data or a soft bit of the read data from the flash memory according to the retry table for verifying the read data in the retry action.

12. The error check and correction method as claimed in claim 9, wherein a calibration procedure, for the processing circuit to calibrate a slice voltage of the flash memory, is defined in the retry table.

13. An error check and correction method of a solid state drive, wherein the solid stage drive comprises a processing circuit for receiving a read command from a host; and a flash memory connected to the processing circuit, wherein the processing circuit comprises an error check and correction controller, and the method comprising the steps of:
  retrieving a block usage information of a block corresponding to a read address in the read command;
  utilizing a first algorithm to verify a read data retrieved from the flash memory when the block usage information is abnormal, and utilizing a predetermined algorithm to verify the read data retrieved from the flash memory when the block usage information is normal;
  outputting the read data when the read data has no uncorrectable error; and
  performing a retry action according to a first retry table when an error of the read data is uncorrectable and the block usage information is abnormal, and performing the retry action according to a second retry table when the error of the read data is uncorrectable and the block usage information is normal, wherein a first usage order of a plurality of algorithms is defined in the first retry table, and a second usage order of the plurality of algorithms is defined in the second retry table, wherein the first usage order is different from the second usage order.

14. The error check and correction method as claimed in claim 13, wherein the plurality of algorithms includes at least two different ECC algorithms for being executed by the ECC controller, wherein, during the retry action, one of the ECC algorithms is selected according the first or the second usage order and executed by the ECC controller to correct the error of the read data.

15. The error check and correction method as claimed in claim 13, wherein the step of performing the retry action further comprises steps of:
  changing the first algorithm to a second algorithm;
  correspondingly generating the read command to verify the read data according to the second algorithm;
  outputting the read data when the read data has no uncorrectable error, and
  changing the second algorithm to a third algorithm when the read data has the uncorrectable error.

16. The error check and correction method as claimed in claim 13, wherein the processing circuit retrieves a hard bit of the read data or a soft bit of the read data from the flash memory according to the first retry table for verifying the read data in the retry action.

17. The error check and correction method as claimed in claim 13, wherein a calibration procedure, for the processing circuit to calibrate a slice voltage of the flash memory, is defined in the first retry table.

18. The error check and correction method as claimed in claim 13, wherein the block usage information is an erase count of the block, a data retention characteristic of the block, a slice voltage or an environmental condition.

19. The error check and correction method as claimed in claim 18, wherein the environmental condition comprises an environment temperature, or an environment humidity.

* * * * *